(12) United States Patent
Lim

(10) Patent No.: US 7,623,175 B2
(45) Date of Patent: Nov. 24, 2009

(54) SOLID STATE IMAGE SENSING DEVICE FOR ANALOG-AVERAGING AND SUB-SAMPLING OF IMAGE SIGNALS AT A VARIABLE SUB-SAMPLING RATE AND METHOD OF DRIVING THE SAME

(75) Inventor: Su-hun Lim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 555 days.

(21) Appl. No.: 11/360,729

(22) Filed: Feb. 23, 2006

(65) Prior Publication Data
US 2006/0187328 A1    Aug. 24, 2006

(30) Foreign Application Priority Data
Feb. 23, 2005    (KR)    ............. 10-2005-0015038

(51) Int. Cl.
*H04N 5/335* (2006.01)
(52) U.S. Cl. .................. 348/308; 348/307
(58) Field of Classification Search ............. 348/222.1, 348/223.1, 230.1, 237, 241–243, 248–250, 348/270–283, 300–308; 341/118, 122, 131, 341/155; 382/312
See application file for complete search history.

(56) References Cited

U.S. PATENT DOCUMENTS

| | | | |
|---|---|---|---|
| 6,025,875 A | 2/2000 | Vu et al. | |
| 6,166,367 A * | 12/2000 | Cho | ................. 250/208.1 |
| 6,211,914 B1 * | 4/2001 | Kubo | ................. 348/241 |
| 6,642,501 B2 * | 11/2003 | Mizuno et al. | ............. 250/214 R |
| 6,956,607 B2 * | 10/2005 | Mizuno et al. | ................. 348/308 |
| 7,002,628 B1 * | 2/2006 | Panicacci | ................. 348/307 |
| 7,098,950 B2 * | 8/2006 | Yamamoto et al. | ............. 348/243 |

(Continued)

FOREIGN PATENT DOCUMENTS

KR    1020020046957 A    6/2002

(Continued)

*Primary Examiner*—Tuan Ho
*Assistant Examiner*—Don Nguyen
(74) *Attorney, Agent, or Firm*—F. Chau & Assoc., LLC

(57) ABSTRACT

Provided are a CMOS image sensor (CIS) type image sensing device for averaging and sub-sampling analog image signals at a variable sub-sampling rate and a method of driving the same. The image sensing device includes: a two-dimensional active pixel sensor (APS) array including pixels arranged in rows and columns; an averaging unit averages reset signals and image signals alternately generated from each of pixels corresponding to odd- numbered and even-numbered rows and columns in based on a predetermined sub-sampling rate in a sub-sampling mode by repeating a method of accumulating, averaging, (and dumping) the reset signals and the image signals, and generating a comparison signal corresponding to a difference between the average of the reset signals and the average of the image signals; and a conventional digital signal output circuit that generates digital signals corresponding to the sub-sampled (averaged) image signals generated from the pixels represented by the comparison signal. The CIS type image sensing device can analog-average image signals output from pixels at a variable sub-sampling rate and carry out a sub-sampling operations for moving pictures, without increasing chip size.

18 Claims, 9 Drawing Sheets

U.S. PATENT DOCUMENTS

| | | | |
|---|---|---|---|
| 7,227,570 B2 * | 6/2007 | Sato et al. | 348/222.1 |
| 7,242,427 B2 * | 7/2007 | Kokubun et al. | 348/241 |
| 7,259,783 B2 * | 8/2007 | Anderson | 348/222.1 |
| 7,276,749 B2 * | 10/2007 | Martin et al. | 257/292 |
| 7,312,431 B2 * | 12/2007 | Rhodes | 250/208.1 |
| 2002/0158982 A1 * | 10/2002 | Kokubun et al. | 348/308 |
| 2003/0117513 A1 * | 6/2003 | Anderson | 348/333.11 |
| 2004/0080629 A1 * | 4/2004 | Sato et al. | 348/222.1 |
| 2004/0245434 A1 * | 12/2004 | Yokomichi | 250/208.1 |
| 2004/0246354 A1 * | 12/2004 | Yang et al. | 348/308 |
| 2005/0001143 A1 * | 1/2005 | Rhodes | 250/208.1 |
| 2005/0174454 A1 * | 8/2005 | Ahn et al. | 348/308 |
| 2005/0179795 A1 * | 8/2005 | Funatsu et al. | 348/302 |
| 2006/0249765 A1 * | 11/2006 | Hsieh | 257/292 |

FOREIGN PATENT DOCUMENTS

| | | |
|---|---|---|
| KR | 1020020058487 A | 7/2002 |
| KR | 1020050121632 | 12/2005 |

\* cited by examiner

SOLID STATE IMAGE SENSING DEVICE FOR ANALOG-AVERAGING AND SUB-SAMPLING OF IMAGE SIGNALS AT A VARIABLE SUB-SAMPLING RATE AND METHOD OF DRIVING THE SAME

BACKGROUND OF THE INVENTION

This application claims the benefit, under 35 U.S.C. §119, of Korean Patent Application No. 10-2005-0015038, filed on Feb. 23, 2005, in the Korean Intellectual Property Office, which is incorporated herein in its entirety by reference.

1. Field of the Invention

The present invention relates to a solid state image sensing device and, more particularly, to a CMOS image sensor (CIS) type image sensing device for averaging and sub-sampling analog image signals (as may be required for producing moving pictures) at a variable sub-sampling rate, and a method of driving the same.

2. Description of the Related Art

A typical solid state image sensing devices is either classified as a complementary metal-oxide semiconductor (CMOS) image sensor (CIS) type device or a charge-coupled device (CCD). Recently, the manufacture of CIS type devices has surpassed that of the CCD type and are used in a variety of fields because the CIS type requires a lower operating voltage and a lower power consumption than that of the CCD type and it may fabricated using a standard CMOS technology and easily integrated with other circuits on the same chip.

CIS type solid state image sensing devices are now commonly mounted in cellular phones (camera phones) and addition to digital still cameras, to capture an image, convert the captured image into an electronic image signal and to transmits the electronic image signal as color image data to a digital signal processor (DSP) for further processing. The digital signal processor DSP processes color image data RGB output from the solid state image sensing device to drive a display device such as a liquid crystal display (LCD).

In a system employing the CIS type solid state image sensing device, a sub-sampling mode of the CIS device outputs an image signal having a reduced vertical resolution. The sub-sampling mode supports a higher frame rate and supports displaying a moving picture, a quick preview for confirming an image before capturing the whole image, and for automatic focusing systems.

FIG. 1 is a block diagram of a conventional complementary metal-oxide semiconductor (CMOS) image sensor (CIS) type solid state image sensing device 100. Referring to FIG. 1, the conventional CIS device 100 includes an active pixel sensor (APS) array 110, a row driver 120 and an analog-to-digital conversion (ADC) unit 130. The row driver 120 receives a control signal from a row decoder (not shown) and the analog-to-digital conversion (ADC) unit 130 receives a control signal from a column decoder (not shown). The CIS device 100 further includes a controller (not shown) that generates timing control signals and addressing signals for outputting a selected and sensed image signal of each pixel.

FIG. 2 is a diagram illustrating the color pixel arrangement of the APS array 110 shown in FIG. 1.

In the CIS device 100, in general, a color filter is arranged over each of the pixels in the APS array 110 such that only (filtered) light of a specific color is received by each pixel. To construct color image signals, at least three colors of filters are arranged on the APS array 110. A general color filter array has Bayer pattern, as shown in FIG. 2, in which, for each set of four color pixels representing one image pixel, two red and green color pixels are arranged in one row and two green and blue color pixels are arranged in another row. Thus in the Bayer Pattern, as shown in FIG. 2, the green color pixels (the most closely related to a luminance signal) are arranged in all rows while the red and blue color pixels are arranged in alternate rows, to improve luminance resolution. A CIS having more than one million color pixels is typically used in a digital still camera in order to provide a suitable image resolution.

The operation of the APS array 110 will now be in detail described with reference to FIGS. 1 and 2.

In the CIS type (solid state image sensing) device 100, each pixel in the APS array 110 senses light using a photodiode (not shown) and converts the sensed light into electric signals to generate image signals. The image signals are output from the APS array 110 as analog signals corresponding to the colors red (R), green (G) and blue (B).

The APS array 110 is constructed in such a manner that the color pixels are arranged in a two-dimensional matrix. A color filter disposed on the APS array 110 typically has the Bayer pattern in which a first two-color sequences of first and second color pixels (e.g., G and B) are arranged in one row and a second two-color pattern of first and third pixels G and R are arranged in another (adjacent) row. However, the color filter is not limited to the Bayer pattern because the pixel array pattern can be constructed in various ways.

A mechanical shutter is opened to allow light to accumulate charges in photodiodes included in the APS array 110 for a predetermined period of time. While the charges are being accumulated in the photodiodes, the APS array 110 generates and outputs the reset signals VRES in response to the reset control signal RG. The final quantity of charges accumulated in each of the photodiodes (when the mechanical shutter closes) is detected in a sequence according to the transfer control signal TG generated by the row driver 120. Assuming that the color filter has the Bayer pattern, the APS array 110 outputs from all columns the first color signals G and the second color signals B from one row of photodiodes, and next outputs from all columns the third color signals R and the first color signals G from the next row, etc. in an image mode. Whenever the photodiode senses light for a predetermined period, the APS array 110 outputs the reset signal to the analog-to-digital conversion unit 130 before the photodiode outputs the sensed image signal to the analog-to-digital conversion unit 130. The analog-to-digital conversion unit 110 receives the reset signal and is reset by it, and then converts the image signal received from the photodiode into a digital signal. The digital signal is output to a digital signal processor and (may be interpolated).

When the CIS device captures a still image, image signals of all the color pixels, sensed by photodiodes of the APS array 110 are output. However, in the sub-sampling mode including for moving picture display, preview and automatic focus, horizontal and vertical resolutions are reduced and image signals are output.

In the conventional CIS device 100 shown in FIG. 1, the analog-to-digital conversion (ADC) unit 130 converts an image signals sensed by the photodiodes into a digital signal. The resolution may be reduced (in the sub-sampling mode) using a correlated double sampling (CDS) method, which is disclosed in U.S. Pat. No. 5,982,318 and U.S. Pat. No. 6,067,113.

Correlated double sampling (CDS) analog-to-digital conversion samples each pixel twice, once for its reset (reference) level and once for the actual image signal. The reference level is subtracted from the image signal, and the difference is amplified and output. Double sampling of the signal eliminates correlated noise that affects both the reference level and the image signal of each pixel. Correlated double sampling (CDS) analog-to-digital conversion includes two steps: first, of receiving a reset signal from the APS array 110 and second, en receiving an image signal sensed by the photodiode, to convert the image signal into a digital signal. The digital signal processor generates a driving signal suitable for the resolution of a display device such as LCD to display the image on the display device.

In the case of a CIS device having an APS array with super extended graphic adapter (SXGA) resolution, for example, the CIS device outputs SXGA-grade image signals when it photographs a still image. However, the CIS device outputs video graphic adapter (VGA)-grade image signals in sub-sampling mode operations. For reference, the number of pixels of SXGA resolution is 1280×1024 and the number of pixels of VGA resolution is 640×480.

Even a CIS device having an APS array with ultra extended graphics adapter (UXGA) resolution may output image signals with less than VGA-grade resolution in the sub-sampling mode to reduce the quantity of processed data. For reference, the number of pixels of UXGA resolution is 1600×1200.

In the sub-sampling mode of the conventional CIS device 100, only image signals of predetermined specific rows and columns are output to the analog-to-digital conversion unit 130, to reduce vertical resolution.

To decrease the SXGA resolution to the VGA resolution, for instance, only a single data corresponding to one pixel at the intersection of one row and column selected from a set of corresponding two rows and two columns, and other data items are removed such that resolution is reduced by half.

When only data corresponding to one row and column is selected from data items corresponding to many (e.g., two or more) rows and columns, the resolution can be further reduced, and thus the quantity of processed data can be further decreased.

However, there exits image data that is not used but is discarded in the sub-sampling mode of the conventional CIS device 100. This causes aliasing noise such that oblique lines on a display are not smoothly connected but may be shown as a zigzag.

To remove the aliasing noise, a method of averaging all image signals in a predetermined range and outputting the averaged image signal has been proposed. The known image signals averaging methods includes: a method of analog-averaging image signals in a predetermined range before image signals sensed by pixels are output to the analog-to-digital conversion ADC unit 130; a method of digital-averaging corresponding digital signals output from the analog-to-digital conversion unit 130.

FIG. 3 is a block diagram of a conventional CIS type solid state image sensing device 300 for digital-averaging of digital signals. Referring to FIG. 3, the operations of an APS array 310 and a row driver 320 are the same as the operations of the APS array 110 and the row driver 120 shown in FIG. 1 so that further explanations thereof are left out.

An analog-to-digital conversion (ADC) unit 330 of the conventional CIS device 300 includes a correlated double sampling (CDS) unit 331 (including a plurality of CDS circuits) and a digital averaging & signal output unit 333. The digital averaging & signal output unit 333 digitally -averages output (digital) signals of the CDS unit 331 and outputs the averaged digital signals to a subsequent digital signal processor (not shown).

FIG. 4 is a block diagram of the correlated double sampling CDS unit 331 shown in FIG. 3. Referring to FIG. 4, each of the plurality of CDS circuits in the CDS unit 331 is connected to one column of the APS array 310 (FIG. 3) and performs an analog-to-digital conversion (a column ADC method) of received analog image signals in the attached column. Each of the plurality of CDS circuits performs a CDS operation with a reset signal (e.g., VRES1, VRES2, . . . and an image signal (SVIG1, VSIG2, . . . ) sensed by pixels, and performs the analog-to-digital conversion using a ramp signal VRAMP generated in a ramp signal generator (not shown). Each of the plurality of CDS circuits outputs a digital signal VCD1.

FIG. 5 is a circuit diagram of one of the correlated double sampling (CDS) circuits 500 (e.g., one of 500-1, or 500-2, etc.) shown in FIG. 4. Referring to FIG. 5, the CDS circuit 500 sequentially receives a reset signal VRES and an image signal VSIG, then compares the resulting voltage signal (corresponding to the difference between the reset signal VRES and the image signal VSIG) with a predetermined reference voltage VREF, and outputs a signal VCD having a modulated pulse width in response to the comparison result.

Each of correlated double sampling CDS circuits 500 (e.g., 500-1, 500-2, 5003, etc.) includes first, second, third and fourth switches S1, S2, S3, and S4, first, second and third capacitors C1, C0, and C2, and first and second amplifiers AMP1 and AMP2. The operation of the correlated double sampling CDS circuit 500 will now be described with reference to FIG. 5.

If the CDS circuit 500 sequentially receives the reset signal VRES and the image signal VSIG and the first through fourth switches S1~S4 are turned ON (i.e., closed) and OFF (i.e., open) at appropriate times, a (voltage) signal VIN corresponding to a difference between the reset signal VRES and the image signal VSIG is applied to the negative input terminal of the first amplifier AMP1. Then, switches S1, S3, and S4 are turned OFF (i.e., opened).

At this time, if a ramp signal VRAMP rises, the input signal VIN increases with the ramp signal VRAMP. The first amplifier AMP1 compares the input signal VIN with the predetermined reference voltage VREF and outputs an output signal VOUT having a pulse width in response to the comparison result.

The second amplifier AMP2 buffers the output signal VOUT1 from the third capacitor C2 and outputs the pulse width modulated signal VCD.

Output signals of each CDS circuit 500 (e.g., 500-1, 500-2, 5003, etc.) are digitally averaged and the digitally averaged digital image signal is transmitted to the subsequent digital signal processor (not shown).

However, digital averaging requires a large-capacity memory so that the chip area and power consumption are increased. Accordingly, the conventional CIS solid state image sensing device with conventional CDS operation is difficult to apply to small-size mobile apparatuses.

SUMMARY OF THE INVENTION

The present invention provides a CMOS image sensor (CIS) type solid state image sensing device capable of analog-averaging and sub-sampling analog image signals (e.g., for producing moving pictures) at a variable sub-sampling rate.

The present invention also provides a method of driving a CIS type solid state image sensing device for analog-averaging and sub-sampling analog image signals required for producing moving pictures at a variable sub-sampling rate.

According to an aspect of the present invention, there is provided a solid state image sensing device comprising an active pixel sensor (APS) array including pixels arranged in two dimensions in rows and columns; an averaging unit for averaging reset signals and image signals that are alternately generated from each of the pixels corresponding and averaging them according to a predetermined sub-sampling rate: by repeating the process of accumulating, averaging, (and sometimes dumping half of) the received reset signals and the received image signals, and generating a comparison signal based on a difference between the averaged reset signal and the averaged image signal; and outputting digital signals (e.g., from a conventional output circuit) corresponding to the image signals generated from the pixels as represented by the comparison signal.

According to an aspect of the present invention, there is provided a solid state image sensing device comprising a plurality of image signal analog-averaging units, each image signal analog-averaging unit comprising: a first image signal averaging switch whose first end is connected to the first switch; a first image signal averaging capacitor, whose first end is connected to a second end of the first image signal averaging switch and whose second end is connected to the second switch, configured to store averaged image signals; a second image signal averaging capacitor, whose first end is connected to the first switch and whose second end is connected to the second switch, configured to store the image signals in a predetermined order; an image signal dumping capacitor, whose first end is connected to the first switch and whose second end is connected to the second switch; a second image signal averaging switch connected between the second image signal averaging capacitor and the image signal dumping capacitor; and an image signal dumping switch connected to and in parallel with the image signal dumping capacitor.

The received image signals stored in the first and second image signal averaging capacitors are averaged when the first image signal averaging switch is turned ON and the second image signal averaging switch is turned OFF. The received image signal stored in the second image signal averaging capacitor is halved by the second image signal averaging capacitor and the image dumping capacitor when the second image signal averaging switch is turned ON and the first image signal averaging switch and the image dumping switch are turned OFF. And, the averaged image signal stored in the image dumping capacitor is dumped when the image dumping switch is turned ON and the second image signal averaging switch is turned OFF.

According to another aspect of the present invention, there is provided a method of driving a solid state image sensing device comprising a two-dimensional APS array including pixels arranged in rows columns, the method comprising: receiving n reset signals at a time from n selected rows of the pixels in a sub-sampling mode wherein n is based on the sub-sampling rate; averaging a first n reset signals received from pixels in a first selected column by separately accumulating each of the first n received reset signals, and then combining the first n received reset signals; averaging a second n reset signals received from pixels in a second selected column by separately accumulating each of the first n received reset signals, and the combining the second n received reset signals; averaging the first and second received reset signals together by combining the first and second combined reset signals together; receiving n image signals at a time from n selected rows of the pixels in a sub-sampling mode wherein n is based on the sub-sampling rate; averaging a first n received image signals by separately accumulating each of the first n received image signals and then combining the first n received image signals; averaging a second n received image signals by separately accumulating each of the first n received image signals and combining the second n received image signals; averaging the first and second n received image signals together by combining the first and second combined image signals together; generating a comparison signal in response to a difference between the average of the reset signals and the average of the image signals.

The present invention will be described more fully below with reference to the accompanying drawings, in which exemplary embodiments of the invention are shown. The invention may, however, be embodied in many different forms and should not be construed as being limited to the exemplary embodiments set forth herein; rather, these embodiments are provided so that this disclosure will be thorough and complete, and will fully convey the basic concepts of the invention to those skilled in the art. Throughout the drawings, like reference numerals refer to like elements.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Figure 6:
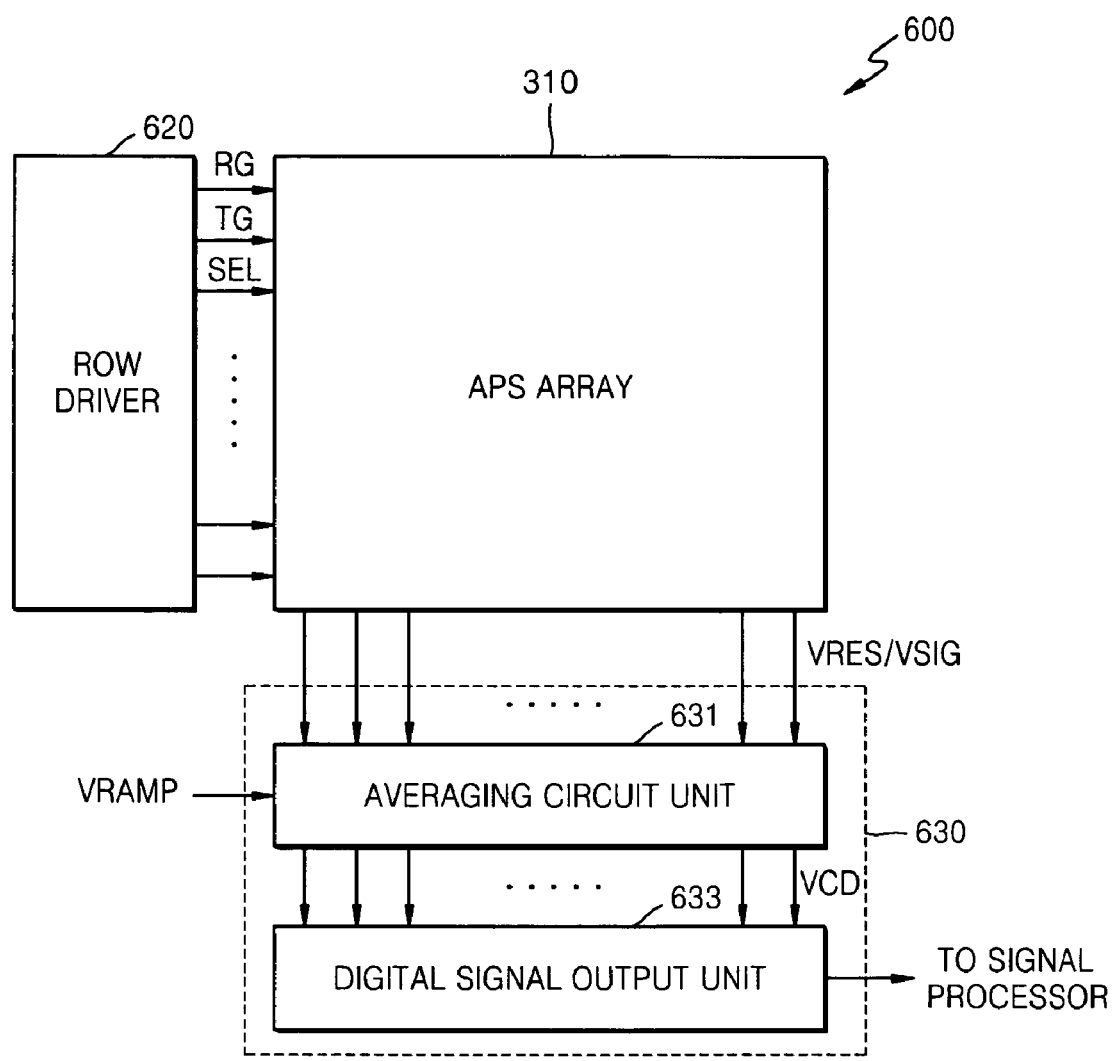
FIG. 6 is a block diagram of a CIS type solid state image sensing device according to an embodiment of the present invention.

FIG. 6 is a block diagram of a CIS type solid state image sensing device 600 according to an embodiment of the present invention. Referring to FIG. 6, the CIS type solid state image sensing device 600 includes an active pixel sensor (APS) array 310, a row driver 620, and an analog-to-digital (ADC) conversion unit 630. The analog-to-digital (ADC) conversion unit 630 includes an analog-averaging unit 631 and a digital image signal output unit 633. The operation of the CIS type solid state image sensing device 600 of FIG. 6 that may be sub-sampled at a variable sub-sampling rate in a sub-sampling mode will now be described.

The APS array 310 is constructed in a manner that the pixels are arranged in a two-dimensional row-column. The APS array 310 generates and outputs the reset signals and image signals from odd- and even-numbered rows alternately selected in response to the sub-sampling rate.

To be more specific, the APS array 310 outputs a first color signal G and a second color signal B from odd-numbered rows column by column and outputs a third color signal R and the first color signal G from the even-numbered rows column by column in response to the sub-sampling rate. The first color signal G, and the second color signal B, and the third color signal R construct a Bayer pattern.

When the sub-sampling rate is 1/2, the total four pixels of each type (of the first, second, third, first colors R, G, B, and G) are averaged. Therefore, four averaged pixels of each color are used to represent a total of sixteen pixels in the 1/2 sub-sampling rate.

When the sub-sampling rate is 1/4, the sixteen pixels of each color (of the first, second, third, first colors R, G, B, and G) are averaged. Therefore, four averaged pixels represent the total sixty-four pixels in the 1/4 sub-sampling rate.

The averaging unit 631 averages reset signals VRES and image signals VSIG generated by each of pixels corresponding to selected odd-numbered rows and selected columns and even-numbered rows and columns selected based on the sub-sampling rate and generates comparison signals VCD each corresponding to a difference between an averaged reset signal and an averaged image signal.

Averaging of the reset signals VRES and image signals VSIG is performed by repeating the process of accumulating the reset signals VRES and image signals VSIG in predetermined capacitors based on the sub-sampling mode, and averaging the accumulated signals, and later dumping the averaged signal.

As described above, the averaging unit 631 generates an average image signal by averaging every image signal of pixels of the APS array 310.

The averaging unit 631 uses a correlated double sampling (CDS) method. The detailed operation of the averaging unit 631 will be further described with reference FIG. 7 which is a block diagram of the averaging unit 631.

The digital signal output unit 633 generates sub-sampled digital signals corresponding to the image signals VSIG generated by pixels as represented by the comparison signals VCD output from the averaging unit 631.

The CIS type solid state image sensing device 600 may be operated at a sub-sampling rate of $$\frac{1}{2^n}.$$

Figure 7:
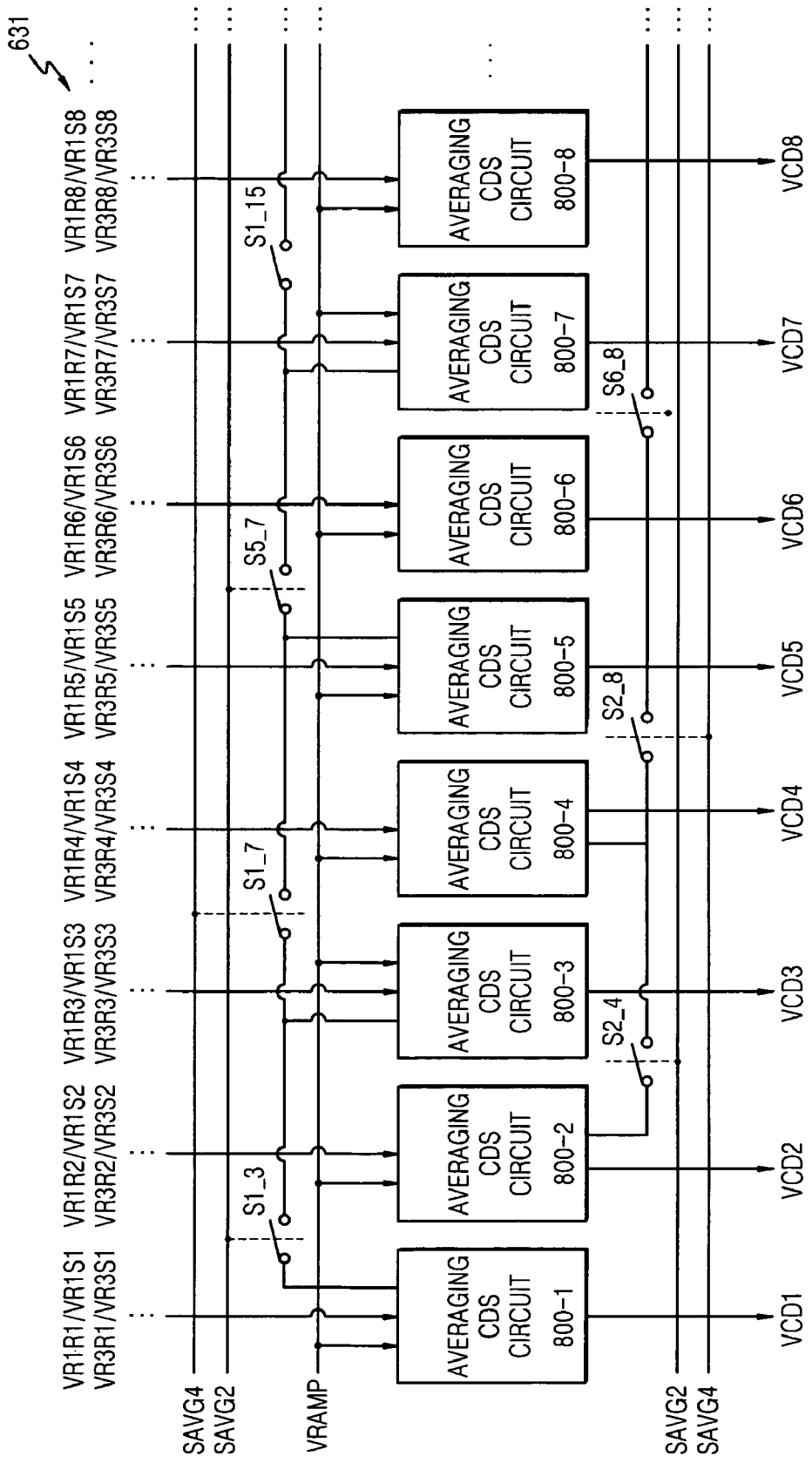
FIG. 7 is a block diagram of the averaging unit 631 shown in FIG. 6

FIG. 7 is a block diagram of the averaging unit 631 shown in FIG. 6. Referring to FIG. 7, the averaging unit 631 includes a plurality of sub-averaging circuits 800 and a plurality of same-color row-averaging switches S1_3, S1_7, S5_7, S1_15, . . . , S2_4, S2_8, S6_8,.

The each one of the plurality of sub-averaging 800 circuits is connected to one column of the APS array 310. Each of the plurality of sub-averaging circuits 800 averages the reset signals VR1R1, VR3R1, . . . , VR1R2, VR3R2, . . . , . . . and averages the image signals VR1S1, VR3S1, . . . , VR1S2, VR3S2,. . . , . . . received from pixels having the same color (in the same column) in the sub-sampling mode and generates a (reset-image signal) comparison signal (difference signal) in response to a ramp signal VRAMP, (based on the averaged reset signal, and the averaged image signal). VRnRm is a reset signal from a pixel in the $n^{th}$ row and the $m^{th}$ column, and VRnSm is an image signal from a pixel in the $n^{th}$ row and the $m^{th}$ column.

The plurality of same-color row-averaging switches S1_3, S1_7, S5_7 , S1_15, . . . , S2_4, S2_8, S6_8, . . . control connections between the plurality of averaging CDS circuits 800. The plurality of same-color averaging switches S1_3, S1_7 S5_7, S1_15, . . . , S2_4, S2_8, S6_8 are used to connect together a plurality of averaging CDS circuits 800 of columns having the same-color pixels (in each row), the number of averaging CDS circuits 800 to be connected together depending on the sub-sampling rate.

The plurality of switches S1_3, S1_7, S5_7, S1_15, . . . , S2_4, S2_8, S6_18 includes a plurality of odd-column row-averaging switches S1_3, S1_7, S5_7, S1_15, . . . and a plurality of even-column row-averaging switches S2_4, S2_8, S6_8, . . .

The plurality of odd-column row-averaging switches S1_3, S1_7, S5_7, S1_15, . . . connect together a number of odd-numbered averaging CDS circuits 800 the number of averaging CDS circuits 800 being based on the index n of the sub-sampling rate $1/2^n$. The plurality of odd-column row-averaging switches are used to average n reset signals and next to average n image signals from pixels in the same row in the odd-numbered columns connected to the odd averaging CDS circuits 800 (e.g., one of 800-1, 800-3, 800-5, 800-7, etc.).

The plurality of even-column row-averaging switches S2_4, S2_8, S6_8, . . . connect together a number (n) of even-numbered averaging CDS circuits 800, the number of averaging CDS circuits 800 being based on the index n of the sub-sampling rate $1/2^n$. The plurality of odd-column row-averaging switches are used to average n reset signals and next to average n image signals from pixels in the same row in the even-numbered columns connected to the even averaging CDS circuits 800 (e.g., one of 800-2, 800-4, 800-6, 800-8, etc.).

Figure 8:
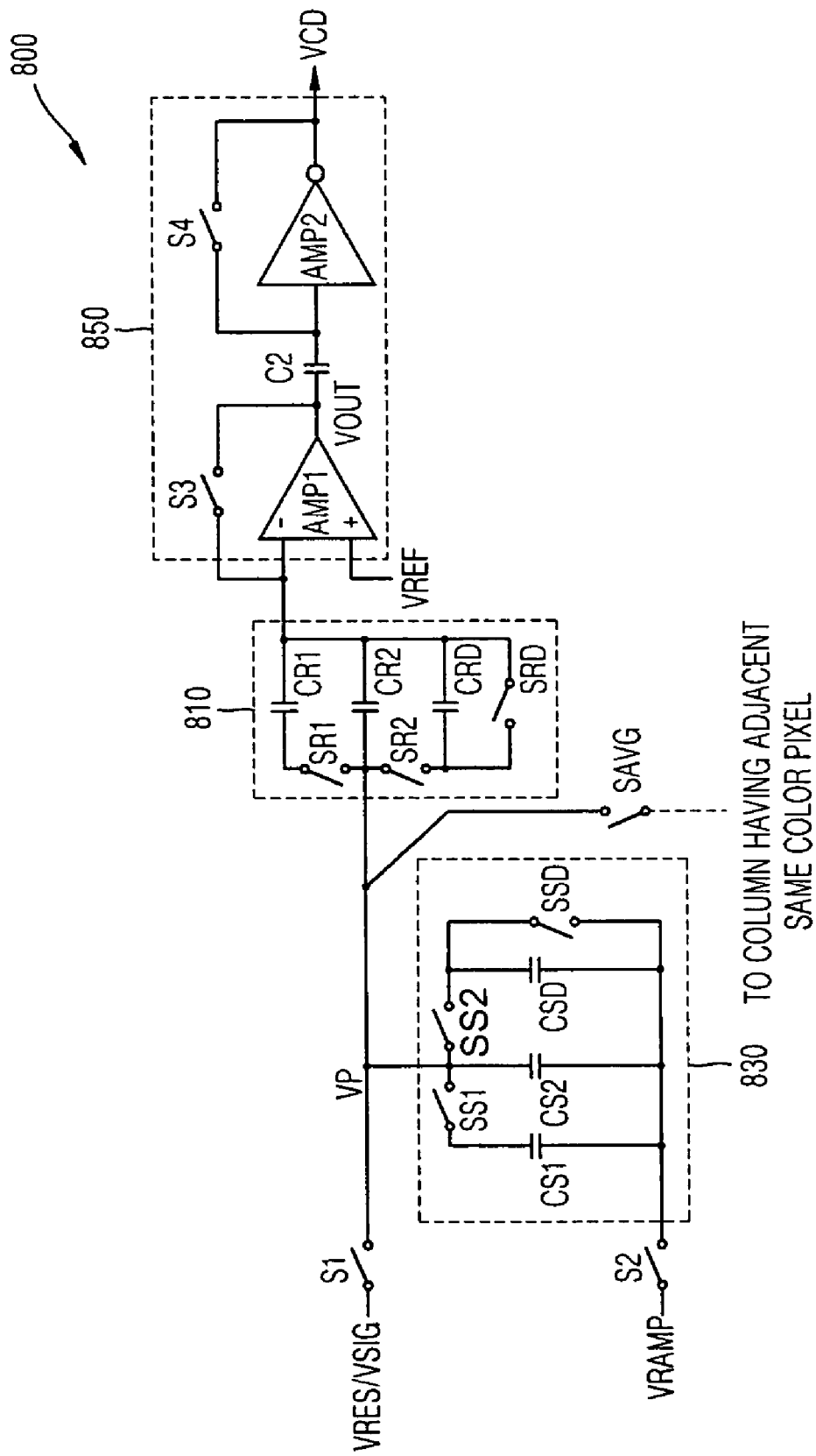
FIG. 8 is a circuit diagram of one of the averaging CDS circuits 800 shown in FIG. 7.

FIG. 8 is a circuit diagram of one of the sub-averaging circuits 800 (e.g., one of 800-1, or 800-2, etc.) shown in FIG. 7. Referring to FIG. 8, each of the plurality of sub-averaging circuits 800 averages a plurality of reset signal and a plurality of image signals input (e.g., when either odd-numbered or even-numbered rows are sequentially selected in response to the sub-sampling rate).

Figure 1:
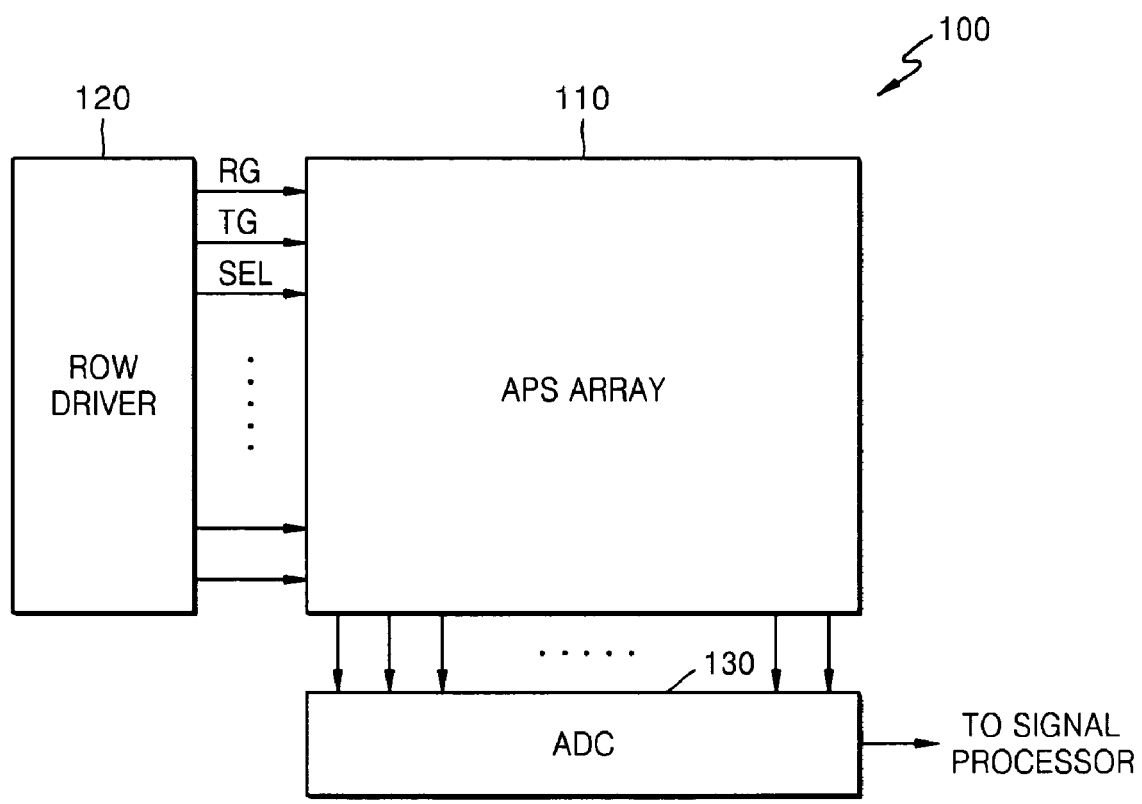
FIG. 1 is a block diagram of a conventional CMOS image sensor (CIS) type solid state image sensing device.
Figure 2:
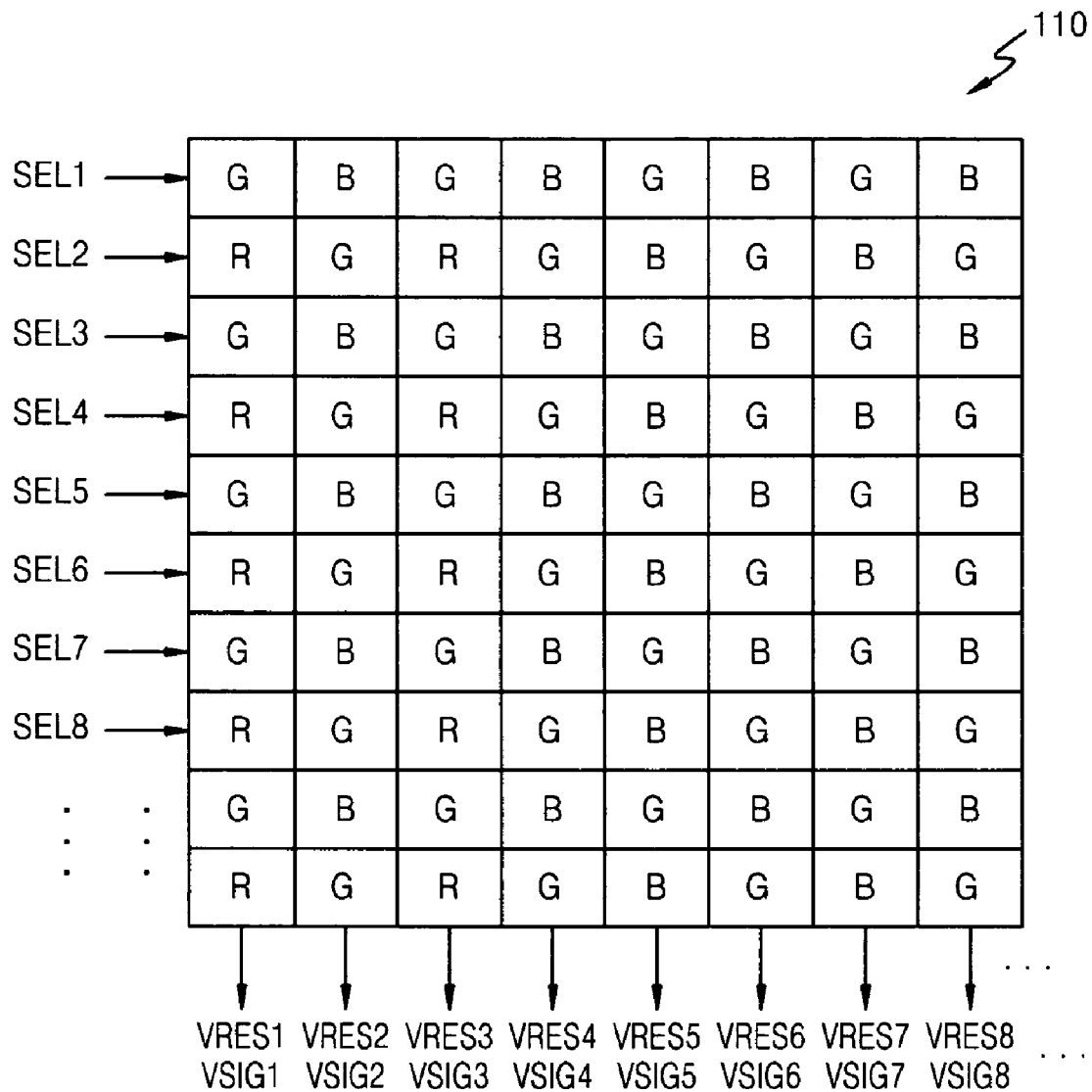
FIG. 2 a diagram illustrating the color pixel arrangement in the active pixel sensor (APS) array 110 shown in FIG. 1.
Figure 3:
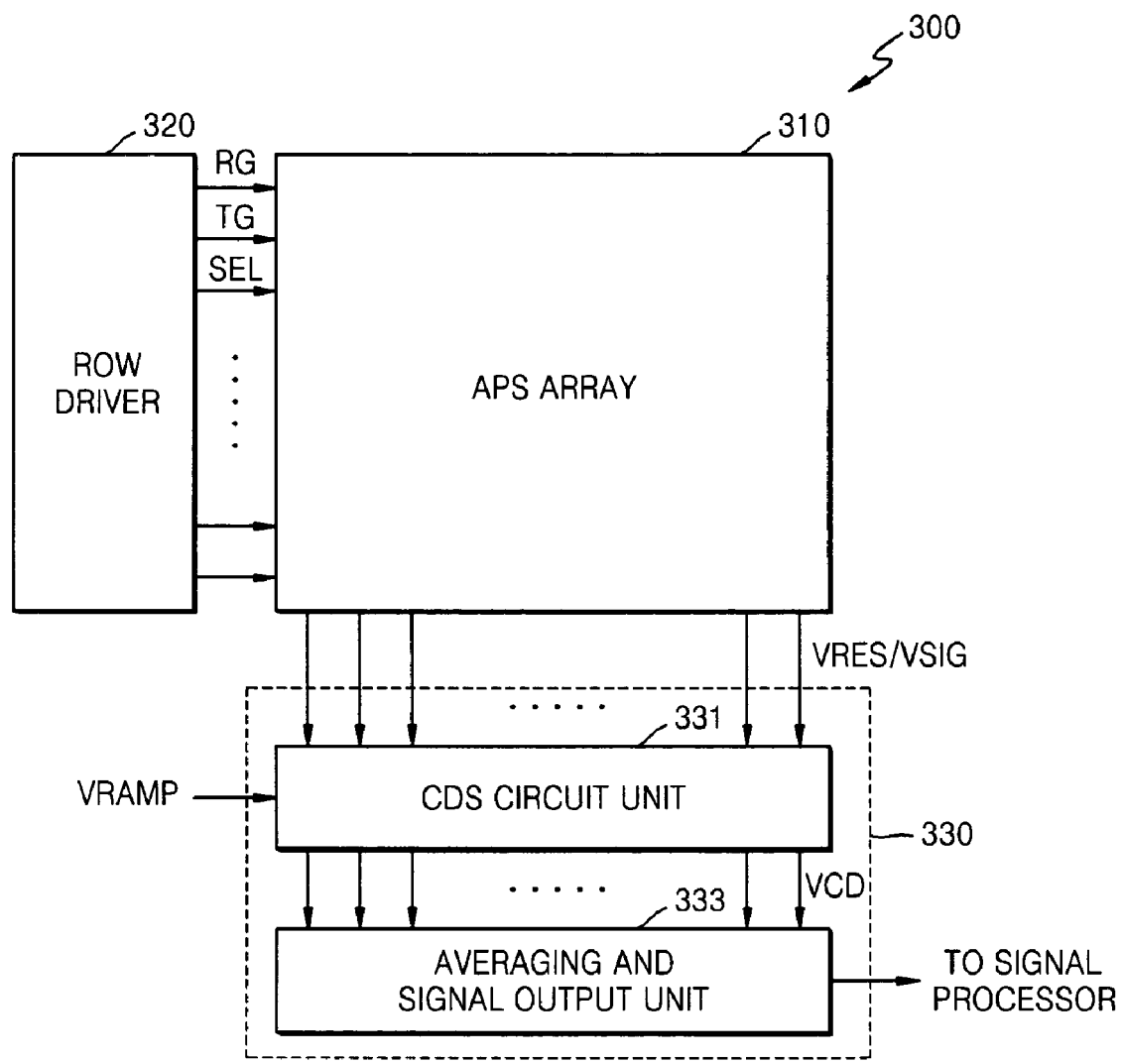
FIG. 3 is a block diagram of a conventional CIS type solid state image sensing device for digital-averaging digital image signals.
Figure 4:
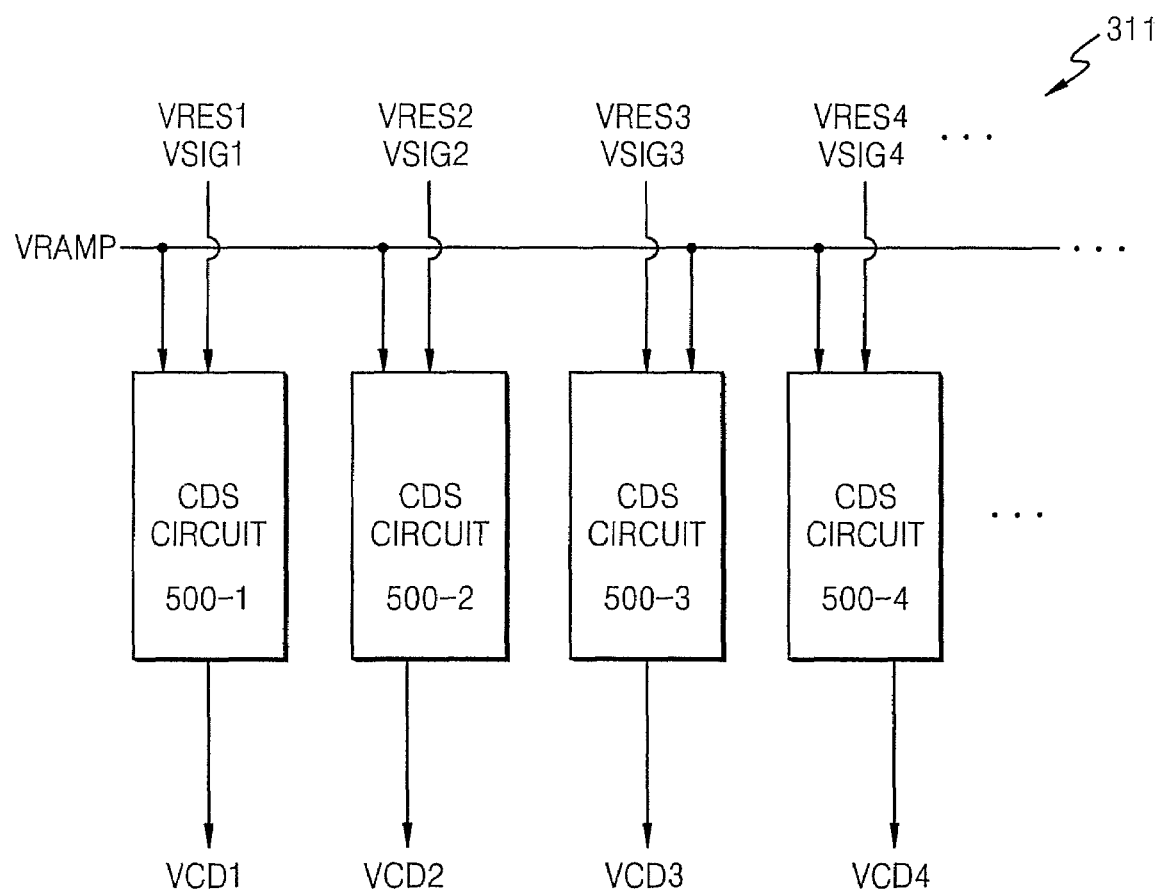
FIG. 4 is a block diagram of the correlated double sampling (CDS) unit 311 shown in FIG. 3.
Figure 5:
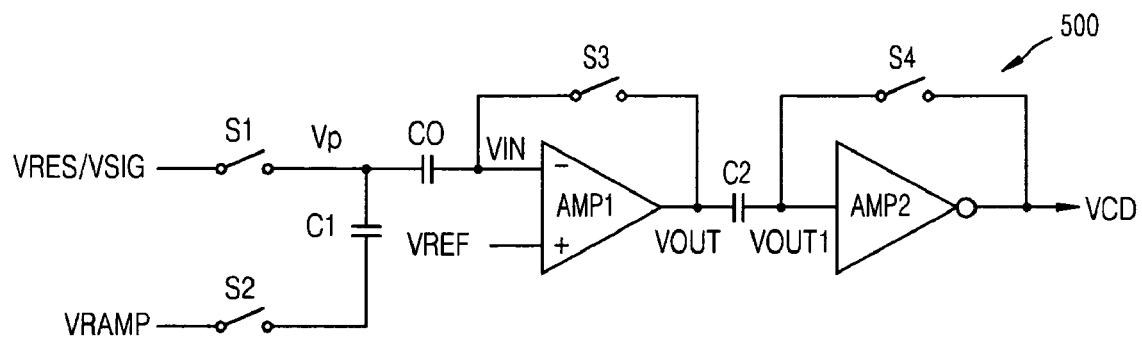
FIG. 5 is a circuit diagram of one of the CDS circuits 500 shown in FIG. 4.

As indicated by the arrangement of color pixels in the array 100 in FIG. 2, when odd-numbered rows are sequentially selected, the odd-numbered sub-averaging circuits (e.g., 800-1, 800-3, 800-5, 800-7) average a plurality of reset signals and an equal plurality of image signals corresponding to the first color G; and the even-numbered sub-averaging circuits (e.g., 800-2, 800-4, 800-6, 800-8) average a plurality of reset signals and an equal plurality of image signals corresponding to the second color B.

Conversely, when even-numbered rows are sequentially selected, the odd-numbered averaging CDS circuits (e.g., 800-1, 800-3, 800-5, 800-7) average a plurality of reset signals and an equal plurality of image signals corresponding to the third color R; and the even-numbered sub-averaging circuits (e.g., 800-2, 800-4, 800-6, 800-8) average a plurality of reset signals and an equal plurality of image signals corresponding to the first color G.

Each of the plurality of averaging CDS circuits 800 includes a first switch S1, a second switch S2, a reset signal averaging unit 810, an image signal averaging unit 830, and a comparison signal generator 850.

Each column of the APS array 310 alternately outputs reset signals and image signals (from pixels in odd-numbered rows and even-numbered rows of the APS) selected based on the sub-sampling rate. The first switch S1 when turned ON, transfers reset signals VRES or image signals VSIG from the APS array 310. The second switch S2 when turned ON, transfers the ramp signal VRAMP.

The reset signal averaging unit 810 averages a sequence of reset signals VRES received from the APS array 310through the first switch S1 (when turned ON). The image signal averaging unit 830 averages a sequence of image signals VSIG received from the APS array 310 through the first switch S1 (when turned On).

The reset signal averaging unit 810 includes a first reset signal averaging switch SR1, a second reset signal averaging switch SR2, a first reset signal averaging capacitor CR1, a second reset signal averaging capacitor CR2, a reset dumping switch SRD, and a reset dumping capacitor CRD.

An end of the first reset signal averaging switch SR1 is connected to the first switch S1. A first end of the first reset signal averaging capacitor CR1 is connected to the first reset signal averaging switch SR1 and a second end thereof is connected to the comparison signal generator 850. The first reset signal averaging capacitor CR1 stores the averaged reset signals received from the APS array 310 during a sub-sampling mode.

A first end of the second reset signal averaging capacitor CR2 is connected to the first switch S1 and a second end thereof is connected to the comparison signal generator 850. The second reset signal averaging capacitor CR2 stores the reset signals VRES received from the APS array 310 during a sub-sampling mode.

A first end of the reset dumping capacitor CRD is connected to the first switch S1 and a second end thereof is connected to a difference node N2 connected to the comparison signal generator 850. The second reset signal averaging switch SR2 is connected between the first end of the second reset signal averaging capacitor CR2 and the first end of the reset dumping capacitor CRD. The reset dumping switch SRD is connected parallel (across the ends of) to the reset dumping capacitor CRD.

The operation of the reset signal averaging unit 810 that averages the reset signals VRES received from the APS array 310 in a sub-sampling mode will now be described with reference to FIGS. 6 through 8.

The reset signals VRES (e.g., VRES1 of APS rows 1 and 3) are input by sequentially selecting odd-numbered (or, alternatively, even-numbered) rows of the APS array 310 in the sub-sampling mode. In the following example, odd-numbered rows (e.g., rows 1 and 3.) are sequentially selected in the sub-sampling mode having a 1/4 sub-sampling rate. The operation of sub-averaging circuit 800-1 connected to the first column is representative of the operation of all sub-averaging circuits 800.

When a first row is selected, (for receiving the reset signal VR1R1) the first switch S1 is turned ON and a reset signal VR1R1 (from a pixel in the first row and the first column) is input to the averaging CDS circuit 800-1. At this time, the first reset signal averaging switch SR1 is turned ON (i.e., closed) and the second reset signal averaging switch SR2 is turned OFF (i.e., open) and the reset dumping switch SRD may be turned OFF (i.e., open). Then the first reset signal averaging capacitor CR1 receives and stores a charge amount corresponding to the reset signal VR1R1 (from the pixel in the first row and first column). Next, the first switch S1 is turned OFF. Then the first reset signal averaging capacitor CR1 stores a charge amount corresponding to the reset signal VR1R1.

When the reset signal VR1R1 (from the pixel in the first row and first column) is completely stored in first reset signal averaging capacitor CR1, the a plurality of odd-column row averaging switches SAVG are turned ON based on the sub-sampling rate, and then OFF. Thus the four reset signals VR1R1, VR1R3, VR1R5, and VR1R7 from the same-color pixels in the first row are averaged (assuming the sub-sampling rate is 1/4).

In the 1/4 sub-sampling rate, a predetermined plurality of the odd-column row-averaging switches SAVG, (e.g., S1_3, S1_7, and S5_7) connected between the averaging CDS circuits 800 connected to four (odd) columns are turned ON and a fourth predetermined odd-column row-averaging switch (e.g., S1_15) is turned OFF. (See FIG. 7). At that time the voltage stored in the first reset signal averaging capacitor CR1 is given by Equation 1 as follows:

$$VCR1 = \frac{1}{4}(VR1R1 + VR1R3 + VR1R5 + VR1R7) \quad \text{[Equation 1]}$$

Next the predetermined plurality of the odd row average switches SAVG, (e.g., S1_3, S1_7, and S5_7) connected between four columns are turned OFF and a fourth predetermined one (e.g., S1_15) is kept OFF. Thus, the average of the four reset signals VR1R1, VR1R3, VR1R5, and VR1R7 from the same-color pixels in the first row is stored in each of the first reset signal averaging capacitors CR1 of four averaging CDS circuits 800 in (800-1, 800-3, 800-5, 800-7) of FIG. 7.

Then, the third row is selected. Thus, the first switch S1 (FIG. 8) in each of the four averaging CDS circuits 800 in (800-1, 800-3, 800-5, 800-7) is turned ON and thus a reset signal VR3R1 of the third row is input to averaging CDS circuit 800-1. At this time, the first and second reset signal averaging switches SR1 and SR2 are turned OFF (open) while the reset dumping switch SRD is turned OFF (open). Thus second reset signal averaging capacitor CR2 receives a charge amount corresponding to the reset signal VR3R1 from a pixel in the third row. Next, the first switch S1 is turned OFF. Thus, the second reset signal averaging capacitor CR2 stores a charge amount corresponding to the reset signal VR3R1.

When the reset signal VR3R1 from a pixel in the third row is completely stored, the same three (n−1=3) same-color row-averaging switches SAVG, (S1_3, S1_7, and S5_7) are turned ON and the four same-color averaging CDS circuits 800 (800-1, 800-3, 800-5, 800-7) are connected together so that their same-color charges (stored in their respective second reset signal averaging capacitors CR2) are averaged. Thus, the (averaged) voltage stored in each of the second reset signal averaging capacitors CR2 is given by Equation 2 as follows:

$$VCR2 = \frac{1}{4}(VR3R1 + VR3R3 + VR3R5 + VR3R7) \quad \text{[Equation 2]}$$

Before inputting a third reset signal VR5R1 (from a pixel in a fifth row) after performing averaging of the reset signals from pixels in the third row, an averaged value of the reset signals VR1R1, VR1R3, VR1R5, VR1R7, VR3R1, VR3R3, VR3R5, and VR3R7 (from pixels in the first and third rows) is stored in the first reset signal averaging capacitor CR1.

In order to perform an averaging of the reset signals from pixels in the first and third rows, the first reset signal averaging switch SR1 is turned ON and the second reset signal averaging switch SR2 and the reset dumping switch SRD are turned OFF. Then, voltage of the first reset signal averaging capacitor CR1 is given by Equation 3 as follows:

$$VCR1 = \frac{1}{8}(VR1R1 + VR1R3 + VR1R5 + VR1R7 + VR3R1 + VR3R3 + VR3R5 + VR3R7) \quad \text{[Equation 3]}$$

When the fifth row is selected, (for inputting a third reset signal VR5R1 from a pixel in the fifth row and the first column), the first switch S1 is turned ON and a reset signal VR5R1 of the fifth row is input. At this time, the first and second reset signal averaging switches SR1 and SR2 are turned OFF and the reset dumping switch SRD may be turned OFF. The second reset signal averaging capacitor CR2 receives a charge amount corresponding to the reset signal VR5R1 from the pixel in the fifth row and the first column. Next, the first switch S1 is turned OFF. Thus the second reset signal averaging capacitor CR2 stores a charge amount corresponding to the reset signal VR5R1.

When the reset signal VR5R1 from a pixel in the fifth row is completely stored (in the second reset signal averaging capacitor CR2), a plurality (e.g., three, since n−1=3) of the odd-column row-averaging switches SAVG, S1_3, S1_7, and S5_7 are turned ON and to average together the reset signals from four pixels in the fifth row. Then the voltage of the second reset signal averaging capacitor CR2 is given by Equation 4 as follows:

$$VCR2 = \frac{1}{4}(VR5R1 + VR5R3 + VR5R5 + VR5R7) \quad [\text{Equation 4}]$$

Before inputting a fourth reset signal VR7R1 (from a pixel in the seventh row and the first column), the previously received reset signals VR1R1, VR1R3, VR1R5, VR1R7, VR3R1, VR3R3, VR3R5, VR3R7, VR5R1, VR5R3, VR5R5, and VR5R7 (from pixels in the first, third, and the fifth rows) are averaged together. Comparing Equations 3 and 4, the weight of the reset signals VR1R1, VR1R3, VR1R5, VR1R7, VR3R1, VR3R3, VR3R5, and VR3R7 is 1/8 in the Equation 3 and the weight of the reset signals VR5R1, VR5R3, VR5R5, and VR5R7 is 1/4 in the Equation 4.

To average the reset signals VR1R1, VR1R3, VR1R5, VR1R7, VR3R1, VR3R3, VR3R5, VR3R7, VR5R1, VR5R3, VR5R5, and VR5R7 in the first, third, and the fifth rows, the weight of the reset signals VR5R1, VR5R3, VR5R5, and VR5R7 in the Equation 4 must be changed (from 1/4) into 1/8.

Therefore, the weight of the reset signals VR5R1, VR5R3, VR5R5, and VR5R7 in the Equation 4 can be changed (from 1/4) into 1/8 by turning ON the second reset signal averaging switch SR2, and then storing (transferring) half (1/2) of the charge averaged reset signal amount stored in the second reset signal averaging capacitor CR2 into the reset dumping capacitor CRD, and then turning OFF the second reset signal averaging switch SR2, and then turning ON the reset dumping switch SRD, thus dumping the charge amount stored in the reset dumping capacitor CRD (i.e., dumping half of the averaged reset signal amount that was stored in the second reset signal averaging capacitor CR2). In this manner, the voltage of the second reset signal averaging capacitor CR2 is given by Equation 5 as follows:

$$VCR2 = \frac{1}{8}(VR5R1 + VR5R3 + VR5R5 + VR5R7) \quad [\text{Equation 5}]$$

An average value of the reset signals VR1R1, VR1R3, VR1R5, VR1R7, VR3R1, VR3R3, VR3R5, VR3R7, VR5R1, VR5R3, VR5R5, and VR5R7 in the first, third, and the fifth rows is obtained and then stored in the first reset signal averaging capacitor CR1, by turning ON the first rest average switch SR1 and thus averaging the charge amounts stored in the first and second reset signal averaging capacitors CR1 and CR2, and then turning OFF the first rest average switch SR1. The voltage of the first reset signal averaging capacitor CR1 is given by Equation 6 as follows:

$$VCR1 = \frac{1}{8}(VR1R1 + VR1R3 + VR1R5 + \quad [\text{Equation 6}]$$
$$VR1R7 + VR3R1 + VR3R3 + VR3R5 +$$
$$VR3R7 + VR5R1 + VR5R3 + VR5R5 + VR5R7)$$

Finally, the seventh row is selected, (for inputting a fourth reset signal VR7R1 from a pixel in the seventh row and the first column), and so the first switch S1 is turned ON and a reset signal VR7R1 from a pixel in the seventh row is input. At this time, the first and second reset signal averaging switches SR1 and SR2 and the reset dumping capacitor CRD are OFF. Then second reset signal averaging capacitor CR2 receives a charge amount corresponding to the reset signal VR7R1 of the seventh row. Next, the first switch S1 is turned OFF. Thus the second reset signal averaging capacitor CR2 stores a charge amount corresponding to the reset signal VR7R1.

When the reset signal VR7R1 of the seventh row is completely stored second reset signal averaging capacitor CR2, a the same predetermined number (3, since n−1=3) of the odd-column row-averaging switches SAVG, S1_3, S1_7, and S5_7 are turned ON and the reset signals from pixels in the seventh row are averaged together. Then the same predetermined odd-column row-averaging switches SAVG, S1_3, S1_7, and S5_7 are turned OFF. Then the voltage stored in the second reset signal averaging capacitor CR2 is given by Equation 7 below:

$$VCR2 = \frac{1}{4}(VR7R1 + VR7R3 + VR7R5 + VR7R7) \quad [\text{Equation 7}]$$

After completely averaging the reset signals received from pixels in the seventh row as above described, the reset signals VR1R1, VR1R3, VR1R5, VR1R7, VR3R1, VR3R3, VR3R5, VR3R7, VR5R1, VR5R3, VR5R5, VR5R7, VR7R1, VR7R3, VR7R5, and VR7R7 received from pixels in the first, third, fifth, and seventh rows are all completely averaged together.

Comparing Equations 6 and 7, the weight of each of the reset signals VR1R1, VR1R3, VR1R5, VR1R7, VR3R1, VR3R3, VR3R5, VR3R7, VR5R1, VR5R3, VR5R5, and VR5R7 is 1/16 in Equation 6 and the weight of each of the reset signals VR7R1, VR7R3, VR7R5, and VR7R7 is 1/4 in Equation 7.

To average together the reset signals VR1R1, VR1R3, VR1R5, VR1R7, VR3R1, VR3R3, VR3R5, VR3R7, VR5R1, VR5R3, VR5R5, VR5R7, VR7R1, VR7R3, VR7R5, and VR7R7 in the first, third, fifth, and seventh rows, the weights of the stored averaged reset signals VR7R1, VR7R3, VR7R5, and VR7R7 in the Equation 7 must be changed into 1/16.

Therefore, such a change is implemented by repeating two times the process of transferring half (1/2) of the charge amount stored in the second reset signal averaging capacitor CR2 into the reset dumping capacitor CRD, and dumping the half charge amount thus stored in the reset dumping capacitor CRD, which is understood by those of ordinary skill in the art. In this manner, the voltage of the second reset signal averaging capacitor CR2 is given by Equation 8 as follows:

$$VCR2 = \frac{1}{16}(VR7R1 + VR7R3 + VR7R5 + VR7R7) \quad \text{[Equation 8]}$$

An average value of the reset signals VR1R1, VR1R3, VR1R5, VR1R7, VR3R1, VR3R3, VR3R5, VR3R7, VR5R1, VR5R3, VR5R5, VR5R7, VR7R1, VR7R3, VR7R5, and VR7R7 in the first, third, fifth, seventh rows is obtained and stored in the first reset signal averaging capacitor CR1 by turning ON the first rest average switch SR1 (while SR2 is OFF) and combining (averaging) the charge amounts stored in the first and second reset signal averaging capacitors CR1 and CR2. Thus, the voltage stored in the first reset signal averaging capacitor CR1 is given by Equation 9 as follows:

[Equation 9]

$$VCR1 = \frac{1}{16}(VR1R1 + VR1R3 + VR1R5 + VR1R7 + VR3R1 + VR3R3 + VR3R5 + VR3R7 + VR5R1 + VR5R3 + VR5R5 + VR5R7 + VR7R1 + VR7R3 + VR7R5 + VR7R7)$$

As shown in FIG. 7, the image signal averaging unit 830 includes a first image signal averaging switch SS1, a second image signal averaging switch SS2, a first image signal averaging capacitor CS1, a second image signal averaging capacitor CS2, an image signal dumping capacitor CSD, and an image signal dumping switch SSD.

An end of the first image signal averaging switch SS1 is connected to the first switch S1. A first end of the first image signal averaging capacitor CS1 is connected to the first image signal averaging switch SS1 and a second end thereof is connected to the second switch S2.

A first end of the second image signal averaging capacitor CS2 is connected to the first switch S1 and a second end thereof is connected to the second switch S2. The second image signal averaging capacitor CS2 stores the image signals received in a predetermined order. The first image signal averaging capacitor CS1 and the second image signal averaging capacitor CS2 are configured to store averaged image signals received through switch S1.

A first end of the image signal dumping capacitor CSD is connected to the first image signal averaging switch SS1 and another end thereof is connected to the second switch S2. The second image signal averaging switch SS2 is connected between the first end of the second image signal averaging capacitor CS2 and the first end of the image signal dumping capacitor CSD. The image signal dumping switch SSD is connected to and in parallel with the image signal dumping capacitor CSD.

Since the method of averaging the image signals VSIG received from pixels by the image signal averaging unit 830 is identical to the method of averaging the reset signals VRES received from pixels in the reset signal averaging unit 810, it's a further redundant description is omitted.

The comparison signal generator 850 compares the voltage difference between the averaged reset signal and the averaged image signal at the difference node N2 with a reference voltage VREF when the voltage at difference node N2 is increased in proportion to the ramp signal VRAMP, and outputs a comparison signal having a logic state based on the comparison result. Since the operation of the comparison signal generator 850 is identical to the operation of the comparison signal generator in a conventional CDS circuit, further description is omitted.

Figure 9:
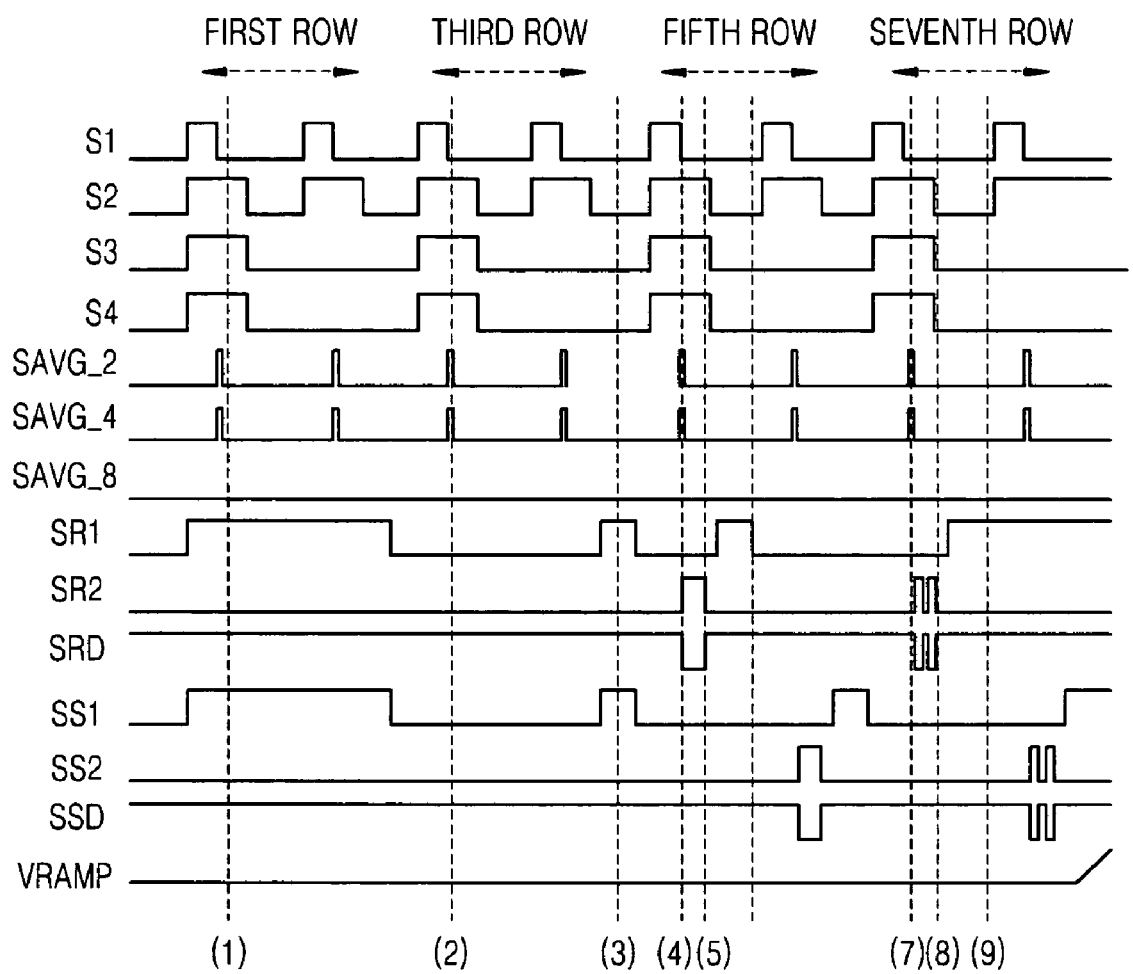
FIG. 9 is a timing diagram of a the CIS device of FIG. 6 operating at a sub-sampling rate of 1/4.

FIG. 9 is a timing diagram of control signals in the CIS type solid state image sensing device of FIG. 6 during sub-sampling mode operation of sub-sampling ratio 1/4. Referring to FIG. 9, S1, S2, S3, S4, SR1, SR2, SRD, SS1, SS2, and SSD are signals for controlling ON-OFF states respectively, of the first, second, third, fourth switches (S1, S2, S3, S4), the first and second reset signal averaging switches (SR1, SR2), the reset dumping switch SRD, the first and second image signal average switches SS1, SS2, and the image signal dumping switch SSD in each averaging CDS circuit 800.

As indicated in FIG. 7, SAVG_2 and SAVC_4 are signals for controlling ON-OFF states of the odd-column row-averaging switches SAVG (S1_3, S5_7, S1_7,) ... and the even-column row-averaging switches SAVC (S2_4, S6_8, and S2_8). SAVG_8 is a signal for controlling ON-OFF of the odd-column row-averaging switches S1_15, ... and the corresponding even-column row-averaging switches S2_16, ... VRAMP is a timing diagram of a ramp signal.

The voltages of the first reset signal averaging capacitor CR1 (and of the second image signal averaging capacitor CS1) at each of points of (1) through (9) corresponds to the voltages indicated respectively by the Equations 1 through 9.

The first switch S1 is turned ON two times while each row is selected for transferring reset signals and then image signals from pixels in each row.

The odd-column row-averaging switches and the even-column row-averaging switches controlled by signals SAVG_2 and SAVC_4 are turned ON after the reset signals and the image signals from each row are received and stored in the averaging CDS circuits 800 to respectively average the reset signals and the image signals received from pixels in each row.

The first reset signal averaging switch SR1 and the first image signal averaging switch SS1 in the averaging CDS circuits 800 are turned ON when the reset signal and the image signal of a first row are input and turned OFF after the averaged reset signal and the averaged image signal in the first row are stored in the first reset signal averaging capacitor CR1 and the first image signal averaging capacitor CS1.

The reset signal and the image signal received from pixels in a third row are stored in the second reset signal averaging capacitor CR2 and the second image signal averaging capacitor CS2 the averaged reset signal and image signal from pixels in the first and third rows are stored in the first reset averaging capacitor CR1 and the first image signal averaging capacitor CS1.

With regard to rows after a fifth row, reset signals and image signals are stored in the second reset signal averaging capacitor CR2 and the second image signal averaging capacitor CS2 and the second reset signal averaging switch SR2, the second image signal averaging switch SS2, the reset dumping switch SRD, and the image signal dumping switch SSD perform the ON-OFF switching operation, and are turned OFF after the averaged reset signals and image signals from pixels in the fifth or seventh row are stored in the first reset averaging capacitor CR1 and the first image signal averaging capacitor CS1 respectively.

The second reset signal averaging switch SR2, the second image signal averaging switch SS2, the reset dumping switch SRD, and the image signal dumping switch SSD alternately perform the ON-OFF switching operation when conversion of the reset signals and the image signals in rows after the fifth row is required (referring to Equations 5 and 8).

As described above, the CIS type solid state image sensing device (CIS device) according to embodiments of the present invention can analog-average image signals received from pixels in an APS and carry out analog sub-sampling and averaging operations (e.g., for moving pictures), and does not increase a chip size.

Accordingly, a CDS operation frequency can be increased and a high frame rate for capturing a moving picture can be obtained. Furthermore, a still image with high resolution can be captured and a moving picture can be captured with a lower consumption power.

Furthermore, since image signals of every row and column are utilized (averaged) without discarding any image signal in the sub-sampling mode operation, signal magnitudes are increased to improve the dynamic range of an output signal and zigzag noise appearing on a display is reduced. Thus, display quality can be enhanced when an embodiment of the CIS solid state image sensing device of the present invention is applied to a mobile imaging system such as a cellular phone and digital camera.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image sensing device comprising:
   a two-dimensional array of pixels arranged in rows and columns, wherein the pixels are configured to alternately generate analog reset signals and analog image signals;
   an averaging unit configured to obtain the average of a number n of reset signals by performing the steps of accumulating, averaging, and dumping the reset signals, and configured to obtain the average of the same number n of image signals by performing the steps of accumulating, averaging, and dumping the image signals, the number n being based on a sub-sampling rate, and configured to generate a comparison signal based on the difference between the average of the reset signals and the average of the image signals; and
   a digital signal output circuit configured to generate sub-sampled digital signals corresponding to averaged image signals represented by the comparison signal.

2. The image sensing device of claim 1, wherein the sub-sampling rate is $1/2^n$, wherein, n denotes a positive integer.

3. The image sensing device of claim 1, wherein the pixels of odd-numbered rows output signals corresponding to a first color and a second color by the column in response to the sub-sampling rate, and the pixels of even-numbered rows output signals corresponding to a third color and the first color by the column in response to the sub-sampling rate.

4. The image sensing device of claim 3, wherein the arrangement of pixels of the first, second, and third colors construct a Bayer pattern.

5. The image sensing device of claim 1, wherein the averaging unit generates averages of image signals using image signals received from every pixel of the array of pixels.

6. The image sensing device of claim 1, wherein the averaging unit performs a correlated double sampling (CDS) method.

7. An image sensing device comprising:
   a plurality of averaging correlated double sampling (CDS) circuits each connected to one column of a pixel array, and
   a plurality of switches configured to establish connections between averaging CDS circuits corresponding to columns having the same color pixels in a each row of the pixel array,
   wherein each averaging CDS circuit is configured to average a plurality of image signals received from pixels having the same color, and to average a plurality of reset signals received from pixels having the same color pixel, and to generate a comparison signal based on the average of the image signals, and the average of the reset signals, and
   wherein each of the plurality of averaging CDS circuits comprises:
   a first switch configured to transfer the reset signals and image signals when turned ON;
   a reset signal averaging unit configured to average the reset signals received through the first switch; and
   an image signal averaging unit configured to average the image signals received through the first switch.

8. The image sensing device of claim 7, wherein the reset signal averaging unit comprises:
   a first reset signal averaging switch whose first end is connected to the first switch;
   a first reset signal averaging capacitor, whose first end is connected to the second end of the first reset signal averaging switch and whose second end is connected to a difference node, configured to store averaged reset signals;
   a second reset signal averaging capacitor, whose first end is connected to the first switch and whose second end is connected to the difference node, configured to receive the reset signals in a predetermined order;
   a reset dumping capacitor whose first end is connected to the first switch and whose second end is connected to the difference node;
   a second reset signal averaging switch connected between the second reset signal averaging capacitor and the reset dumping capacitor; and
   a reset dumping switch connected to and in parallel with the reset dumping capacitor.

9. The image sensing device of claim 8, wherein:
   the received reset signals stored in the first and second reset signal averaging capacitors are averaged when the first reset signal averaging switch is turned ON and the second reset signal averaging switch is turned OFF,
   the reset signal stored in the second reset signal averaging capacitor is halved by the second reset signal averaging capacitor and the reset dumping capacitor when the second reset signal averaging switch is turned ON and the first reset signal averaging switch and the reset dumping switch are turned OFF; and
   the half of the averaged reset signal stored in the reset dumping capacitor is dumped when the reset dumping switch is turned ON and the second reset signal averaging switch is turned OFF.

10. The image sensing device of claim 7, wherein the image signal averaging unit comprises:
   a first image signal averaging switch whose first end is connected to the first switch;
   a first image signal averaging capacitor, whose first end is connected to a second end of the first image signal averaging switch and whose second end is connected to the second switch, configured to store averaged image signals;
   a second image signal averaging capacitor, whose first end is connected to the first switch and whose second end is connected to the second switch, configured to store the image signals in a predetermined order;

an image signal dumping capacitor, whose first end is connected to the first switch and whose second end is connected to the second switch;

a second image signal averaging switch connected between the second image signal averaging capacitor and the image signal dumping capacitor; and an image signal dumping switch connected to and in parallel with the image signal dumping capacitor.

11. The image sensing device of claim 10, wherein:

the received image signals stored in the first and second image signal averaging capacitors are averaged when the first image signal averaging switch is turned ON and the second image signal averaging switch is turned OFF;

the received image signal stored in the second image signal averaging capacitor is halved by the second image signal averaging capacitor and the image dumping capacitor when the second image signal averaging switch is turned ON and the first image signal averaging switch and the image dumping switch are turned OFF; and the averaged image signal stored in the image dumping capacitor is dumped when the image dumping switch is turned ON and the second image signal averaging switch is turned OFF.

12. An image sensing device comprising:

a plurality of averaging correlated double sampling (CDS) circuits each connected to one column pixel array, and a plurality of switches configured to establish connections between averaging in CDS circuits corresponding to columns having the same color pixels in a each row of the pixel array, wherein each averaging CDS circuit is configured to average a plurality of image signals received from pixels having the same color, and to average a plurality of reset signals received from pixels having the same color pixel, and to generate a comparison signal based on the average of the image signals, and the average of the reset signals, wherein the plurality of switches comprises:

odd-column row-averaging switches connecting a number n of odd-numbered averaging CDS circuits; and even-column row-averaging switches connecting a number n of even-numbered averaging CDS circuits equal to the number n.

13. A method of driving an image sensing device comprising a two-dimensional array of pixels arranged in rows and columns, the method comprising:

receiving n reset signals at a time from n selected rows of the pixels in a sub-sampling mode wherein n is based on the sub-sampling rate;

averaging a first n reset signals received from pixels in a first selected column by separately accumulating each of the first n received reset signals, and then combining the first n received reset signals;

averaging a second n reset signals received from pixels in a second selected column by separately accumulating each of the second n received reset signals, and then combining the second n received reset signals;

averaging the first and second received reset signals together by combining the first and second combined reset signals together;

receiving n image signals at a time from n selected rows of the pixels in a sub-sampling mode wherein n is based on the sub-sampling rate;

averaging a first n received image signals by separately accumulating each of the first n received image signals and then combining the first n received image signals;

averaging a second n received image signals by separately accumulating each of the first n received image signals and combining the second n received image signals;

averaging the first and second n received image signals together by combining the first and second combined image signals together;

generating a comparison signal in response to a difference between the average of the reset signals and the average of the image signals.

14. The method of claim 13, wherein the sub-sampling rate is $1/2^n$, wherein, n denotes a positive integer.

15. The method of claim 14, wherein when n is 1, the averaging of image signals comprises:

averaging image signals received from a first selected row;

averaging image signals received from a second selected row; and averaging together the average of the image signals received from the first selected rows and the average of the image signals received from the second selected row.

16. The method of claim 14, wherein when n is more than 2, the averaging of the image signals comprises:

averaging image signals received from a first selected row;

averaging image signals received from a second selected row;

averaging together the average of the image signals received from the first selected row and the average of the image signals received from the second selected row; and averaging image signals received from a third selected row, dumping half of the average of the image signals received from the third selected row, and averaging the remaining half of the average of the image signals received from the third selected row together with the average of the image signals received from the first selected row and second selected row.

17. The method of claim 14, wherein when n is 1, the averaging of the received reset signals comprises:

averaging reset signals received from a first selected row;

averaging reset signals received from a second selected row; and averaging together the average of the reset signals received from the first selected rows and the average of the reset signals received from the second selected row.

18. The method of claim 14, wherein when n is more than 2, the averaging of the reset signals comprises:

averaging reset signals received from a first selected row;

averaging reset signals received from a second selected row;

averaging together the average of the reset signals received from the first selected row and the average of the reset signals received from the second selected row;

averaging reset signals received from a third selected row;

dumping half of the average of the reset signals received from the third selected row; and averaging the remaining half of the average of the reset signals received from the third selected row together with the average of the reset signals received from the first and second selected rows.

* * * * *